United States Patent [19]

Teng et al.

[11] Patent Number: 4,958,206
[45] Date of Patent: Sep. 18, 1990

[54] DIFFUSED BIT LINE TRENCH CAPACITOR DRAM CELL

[75] Inventors: Clarence W. Teng; Robert R. Doering; Dirk Anderson, all of Plano, Tex.

[73] Assignee: Texas Instruments Incorporated, Dallas, Tex.

[21] Appl. No.: 212,452

[22] Filed: Jun. 28, 1988

[51] Int. Cl.$^5$ ............... H01L 29/78; H01L 29/06; H01L 27/12
[52] U.S. Cl. ................... 357/23.6; 357/55; 357/49
[58] Field of Search .................. 357/23.6, 55, 49

[56] References Cited

U.S. PATENT DOCUMENTS

| | | | |
|---|---|---|---|
| 4,017,885 | 4/1977 | Kendall et al. | 357/51 |
| 4,164,751 | 8/1979 | Tasch, Jr. | 357/41 |
| 4,199,772 | 4/1980 | Natori et al. | 357/23 |
| 4,353,086 | 10/1982 | Jaccodine et al. | 357/51 |
| 4,369,564 | 1/1983 | Hiltpold | 29/571 |
| 4,397,075 | 8/1983 | Fatula, Jr. et al. | 29/571 |
| 4,432,006 | 2/1984 | Takei | 357/23 |
| 4,462,040 | 7/1984 | Ho et al. | 357/23 |
| 4,472,240 | 9/1984 | Kameyama | 156/648 |
| 4,630,088 | 12/1986 | Ogura et al. | 357/23.6 |
| 4,636,281 | 1/1987 | Buiguez et al. | 156/643 |
| 4,649,625 | 3/1987 | Lu | 29/571 |
| 4,650,544 | 3/1987 | Erb et al. | 156/653 |
| 4,651,184 | 3/1987 | Malhi | 357/23.6 |
| 4,672,410 | 6/1987 | Miura et al. | 357/23.6 |
| 4,673,962 | 6/1987 | Chatterjee et al. | 357/23.6 |
| 4,683,486 | 7/1987 | Chatterjee | 357/23.6 |
| 4,717,942 | 1/1988 | Nakamura et al. | 357/23.6 |
| 4,751,558 | 6/1988 | Kenney | 357/23.6 |
| 4,786,954 | 11/1988 | Morie et al. | 357/45 |

FOREIGN PATENT DOCUMENTS

| | | |
|---|---|---|
| 108390 | 5/1984 | European Pat. Off. |
| 167764 | 1/1986 | European Pat. Off. |
| 176254 | 4/1986 | European Pat. Off. |
| 186875 | 7/1986 | European Pat. Off. |
| 88451 | 9/1988 | European Pat. Off. |
| 3508996 | 10/1985 | Fed. Rep. of Germany |
| 51-130176 | 12/1976 | Japan |
| 57-10973 | 1/1982 | Japan |
| 59-141262 | 2/1983 | Japan |
| 59-19366 | 1/1984 | Japan |
| 59-103373 | 6/1984 | Japan |
| 60-12752 | 1/1985 | Japan |
| 60-182161 | 9/1985 | Japan |
| 60-213053 | 10/1985 | Japan |
| 61-36965 | 2/1986 | Japan |
| 2168195A | 12/1985 | United Kingdom |

OTHER PUBLICATIONS

"Dynamic RAM with Merged Drain and Storage", IBM Technical Disclosure Bulletin, vol. 27, No. 11, Apr. 1985, pp. 6694–6696.

Jambotkar; IBM TDB, vol. 27, No. 2, Jul. 1984; pp. 1313–1320.

Nakajima et al.; IEDM; 1984; pp. 240–243.

Primary Examiner—Rolf Hille
Assistant Examiner—Robert P. Limanek
Attorney, Agent, or Firm—Richard A. Stoltz; James T. Comfort; Melvin Sharp

[57] ABSTRACT

A trench (28) of a DRAM cell is formed in a (p−) epitaxial layer (10) and a silicon substrate (12), and a storage oxide (32) is grown on the sidewalls (30) of the trench (28). A highly doped polysilicon capacitor electrode (34) is formed in the trench (28). A portion (52) of the storage oxide (32) is removed from a selected side of the sidewalls (30), and a plug (68) is deposited therein and etched back so that the electrode (34) is connected to the epitaxial layer (10). A thermal cycle is used to diffuse dopant from the capacitor electrode (34) into and through the plug (68) and into the adjacent semiconductor layer (10) to make the plug (68) conductive and to form a source region (66) of a pass gate transistor of the cell.

15 Claims, 4 Drawing Sheets

DIFFUSED BIT LINE TRENCH CAPACITOR DRAM CELL

TECHNICAL FIELD OF THE INVENTION

This invention relates in general to trench-capacitor memory cells, and more particularly to a minimum-dimension memory cell with a trench capacitor and a diffused bit line.

BACKGROUND OF THE INVENTION

Trench-capacitor dynamic random access memory (DRAM) cells have recently been developed in a continuing effort to fit the maximum charge storage capacity into the smallest space. Most conventional DRAM cells of this type comprise a capacitor trench having a storage oxide grown on its sidewalls. A grounded capacitor electrode fills this trench, and an (n+) doped region surrounds the trench in the semiconductor layer and extends to form a source region for the corresponding field effect pass gate transistor. A (p) pass gate channel region connects this source region to an (n+) diffused drain region of the pass gate transistor.

An undesirably large space is required to be laid out between the side of the trench capacitor opposite the pass gate transistor and the next cell. This is because a parasitic transistor will otherwise form between the (n+) implantation surrounding the capacitor trench and the (n+) drain region of the next pass gate transistor. Prior art attempts to minimize these parasitic transistors include providing local oxide isolating structures that still take up an undesirably large amount of cell area.

More recently, Lu et al. have proposed a trench-capacitor memory cell that stores the charge on the trench electrode rather than in a surrounding diffused region (N. C. Lu, "A Substrate-Plate Trench-Capacitor (SPT) Memory Cell for Dynamic RAM's", *IEEE Journal of Solid State Circuits*, Vol. SC-21, No. 5, pages 627–633 (October, 1986)). In this cell, a conductive plate connects an upper surface of the capacitor electrode to an adjacent source region of the pass gate transistor, spanning the capacitor storage oxide on the surface of the epitaxial layer. A metallic bit line is coupled to a drain region of the pass gate transistor.

This proposed cell has the disadvantage of requiring at least two layers of metal or other conductor thus complicating the cell's fabrication. A need therefore exists for a minimum-dimension trench-capacitor DRAM cell that requires only one level of metal interconnect while at the same time avoiding the large spacing requirements of conventional cells between the trench capacitor and the pass gate transistor of the next adjacent cell.

SUMMARY OF THE INVENTION

One aspect of the invention comprises a memory cell formed in a semiconductor layer of a first conductivity type. A trench is formed into a face of the semiconductor layer and sidewalls of the trench have a storage insulator formed thereon to define a trench hole. A conductive capacitor electrode is formed in the trench hole. A portion of the storage insulator is removed from a selected side of the sidewalls to create a gap that extends downwardly from the upper surface of the capacitor electrode by a predetermined depth. A conductive plug is formed in this gap to electrically connect the electrode to an adjacent region of the semiconductor layer. This adjacent region is doped to be of a second conductivity type and forms a diffused region of a respective pass gate transistor.

In another aspect of the invention, an array of trench-capacitor memory cells is formed in the semiconductor layer. A plurality of spaced-apart elongate bit lines of the second conductivity type are formed in the layer, and a plurality of spaced-apart elongate parallel conductive word lines are formed so as to be insulatively disposed over the face of the semiconductor layer, and at an angle to the bit lines. A plurality of memory cells are formed in between the bit lines and each has a trench capacitor and a pass gate transistor. A diffused region of the transistor is formed to be of the second conductivity type, and to be electrically coupled to an electrode of the capacitor. A transistor channel region of the first conductivity type is disposed on the face between the diffused region and one of the bit lines. A thin pass gate insulator is formed on the face over the channel region, and one of the word lines is formed over the pass gate insulator for actuation of the transistor.

Yet another aspect of the invention comprises a method for fabricating a memory cell in a semiconductor layer. First, a trench is formed into the layer, followed by the formation of a sidewall insulator on the sidewalls of the trench. A highly doped polycrystalline or amorphous material comprising silicon is deposited in the trench to form a capacitor electrode. A selected portion of the sidewall insulator is removed to create a gap between the electrode and the semiconductor layer, the gap extending from the outer face of the electrode inwardly along the sidewall for a predetermined depth. A substantially undoped polycrystalline or amorphous semiconductor material comprising silicon is deposited in the gap, and this material is doped to form a conductive plug. The plug electrically couples the electrode to an adjacent region of the semiconductor layer. Preferably, this region of the semiconductor layer is doped by diffusing dopant from the capacitor electrode through the plug into the adjacent semiconductor layer to form a diffused region of the respective pass gate transistor.

A principal advantage of the present invention is its avoidance of a large spacing requirement between the capacitor electrode and the pass gate transistor of an adjacent cell. This is because the charge is stored in the capacitor electrode rather than around the trench periphery, and no (n+) region is formed in the semiconductor layer around the trench. Therefore, no parasitic transistor is formed between this region and a drain region of the next pass gate transistor. Thus, the spacing between the capacitor electrode and the next pass gate transistor or bit line can be reduced to that required for misalignment tolerance.

Another advantage of the invention inheres in its avoidance of an extra layer of conductive interconnects. This advantage results from the use of a storage oxide gap plug to electrically couple the capacitor electrode to an adjacent source region of the pass gate transistor, together with the use of diffused bit lines rather than their metal or polysilicon counterparts. With 1.0 micron design rules, the cell size of the invention can be scaled to approximately 2.6×4.1 microns, suitable for 4 megabit DRAMs. Using 0.6 micron design rules, the cell is suitable for 16 megabit DRAMs.

BRIEF DESCRIPTION OF THE DRAWINGS

Other aspects of the invention can be discerned from the following detailed description taken in conjunction with the drawings, in which.

DETAILED DESCRIPTION OF THE INVENTION

Figure 1A:
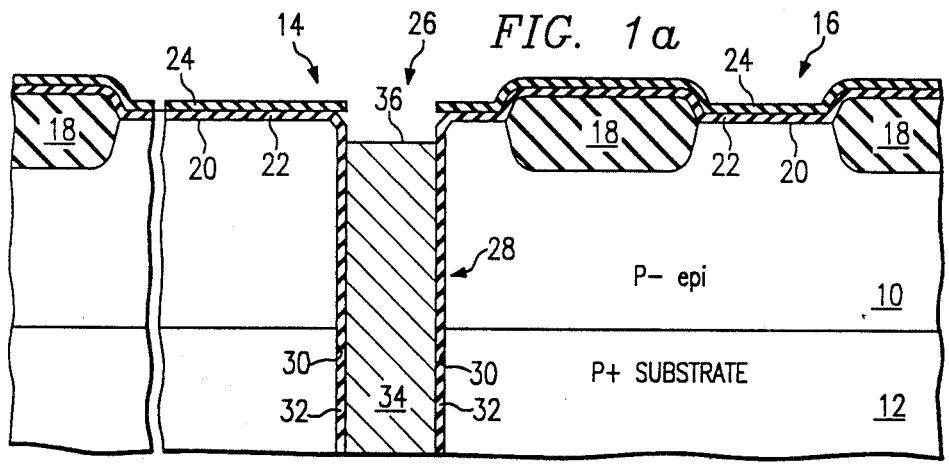
FIGS. 1a-1f are greatly enlarged schematic sectional views of a semiconductor substrate and epitaxial layer, showing successive stages in the fabrication of a DRAM cell according to the invention.

FIG. 1 is a greatly enlarged sectional view showing the beginning stages of fabrication of a DRAM cell according to the invention. In this embodiment, a (p−) epitaxial layer 10 is formed on a (p−) semiconductor substrate 12. The concentration of dopant in the epitaxial layer 10 can be on the order of $10^-$ ions/cm$^3$, and that of the substrate 12 can be $10^{19}$ ions/cm$^3$. The portion of substrate 12 and epitaxial layer 10 shown is in an active device region of the wafer that is surrounded by field oxide.

To illustrate the process according to the invention, a DRAM array area is shown generally at 14 and a peripheral area is indicated generally at 16. Active device areas 14 and 16 are isolated by field oxide isolating structures 18. Field oxide structures 18 are selectively grown from epitaxial layer 10 according to conventional methods.

An oxide/nitride/oxide hard mask is formed over an outer surface 20 of epitaxial layer 10. This trilayer mask includes a first, thin oxide layer 22 that is grown from epitaxial layer 10 until layer 22 is about 350 Angstroms in thickness. This is followed by a nitride layer 24 that is about 1500 Angstroms thick. The deposition of nitride layer 24 is followed by a second, thick oxide layer (not shown) whose thickness falls in the range of 5000 to 10,000 Angstroms. The oxide/nitride/oxide hard mask is patterned with a layer (not shown) of photoresist in order to define a trench area indicated generally at 26. The hard mask is then plasma-etched in a single step with CHF$_3$/C$_2$F$_6$ chemistry.

The photoresist layer (not shown) is next stripped and a trench 28 is anisotropically etched with an etchant such as chlorine until it extends through epitaxial layer 10 into semiconductor substrate 12. It is preferred that trench 28 be about 6 to 10 microns deep. The deepest portion of trench 28 is not shown in FIGS. 1a-1f.

After trench 28 has been etched, a hydrogen fluoride solution is used to remove any trench residues on the sidewalls 30 of trench 28. The HF solution will somewhat undercut first oxide layer 22, and will remove the top oxide layer (not shown) of the oxide/nitride/oxide hard mask.

In the next step, a storage oxide layer 32 is grown on the sidewalls 30 (and on the bottom, not shown) of trench 28. Storage oxide layer 32 can be on the order of 100 to 150 Angstroms thick. A layer of heavily doped (p+) polycrystalline or amorphous silicon is then deposited as by low-pressure chemical vapor deposition (LPCVD) on the wafer to fill trench 28. This preferably polysilicon layer can have a dopant concentration of $10^{20}$ ions/cm$^3$. The polysilicon layer is etched back as with an SF$_6$ plasma or a wet etch to define a plurality of trench capacitor electrodes 34 inside respective trenches 28 (one each shown). Because of the etch non-uniformity, an upper surface 36 of capacitor electrode 34 may be somewhat recessed from the outer surface 20 of epitaxial layer 10. After the etchback of the polysilicon, nitride layer 24 is removed.

Figure 1B:
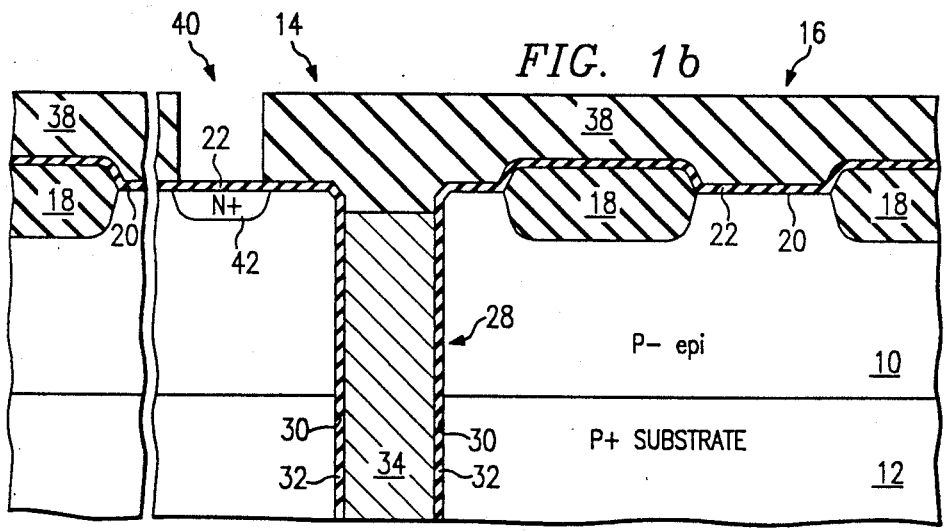

Turning now to FIG. 1b, a layer 38 of photoresist is deposited on oxide layer 22 and electrode surface 36 and patterned to define a bit line implantation area indicated generally at 40. An (n+) implant is performed with arsenic and phosphorus through the thin oxide layer 22. The arsenic can be implanted at a dose of about $3 \times 10^{15}$ ions/cm$^2$ and at an implantation energy of about 150 KeV. The phosphorus can be implanted at a dose of about $4 \times 10^{14}$ ions/cm$^2$ and an implantation energy of about 100 KeV. These implantations will form an (n+) diffused bit line 42. The photoresist layer 38 is then stripped.

Figure 1C:
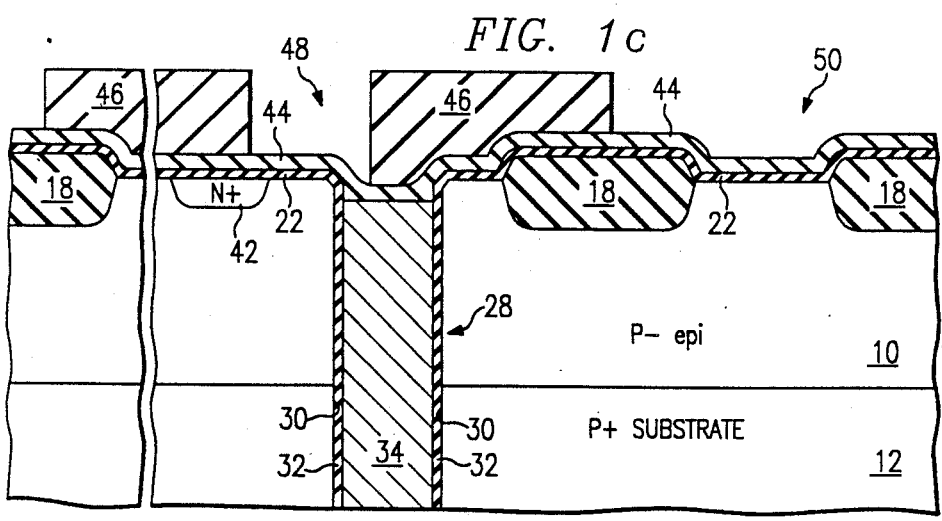
Figure 1D:
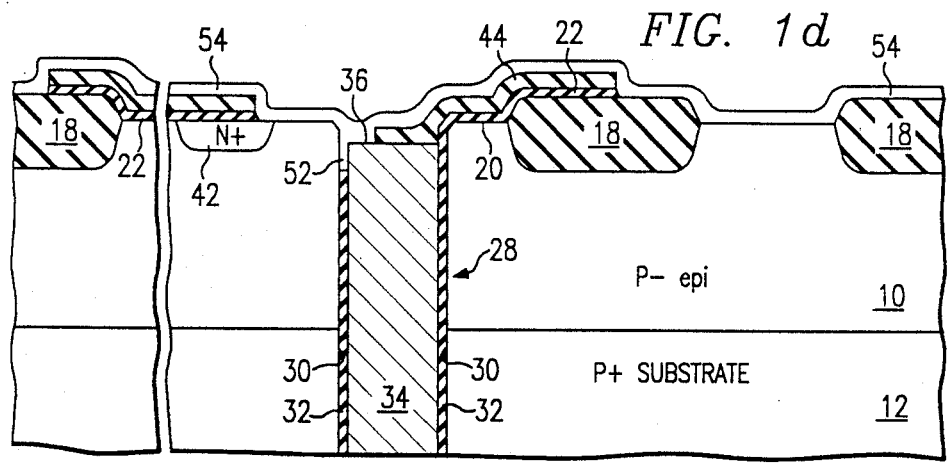

Referring next to FIG. 1c, a layer 44 of oxide is deposited over oxide layer 22 and upper surface 36 of capacitor electrode 34 by chemical vapor deposition (CVD) until it is about 2000 to 4000 Angstroms thick. A layer 46 of photoresist is then deposited and patterned to define a transistor pass gate area indicated generally at 48. This photoresist pattern also defines a peripheral circuit area 50. Pass gate area 48 extends from a point over diffused bit line 42 over to expose a portion of upper surface 36 of capacitor electrode 34. The remaining portion of upper surface 36 remains masked so that oxide 44 is exposed over only one side of capacitor electrode 34.

The exposed areas 48 and 50 of oxide layers 44 and 22 are then etched away. This can either be performed with a CHF$_3$ plasma etch or an HF wet etch. Oxide layers 44 and 22 are intentionally overetched such that a selected portion of storage oxide 32 is removed to form a gap 52 in between capacitor electrode 34 and sidewall 30. The amount of overetch will determine the depth of gap 52 as measured from upper surface 36 of capacitor electrode 34, which is preferred to be in the range of 3000 to 5000 Angstroms. An additional lithography (not shown) may be needed to protect the peripheral isolation oxide layer 18 from being etched. Gap 52 will only be about 150 Angstroms thick, as this was the thickness of storage oxide 32.

The overetch of oxide layers 44 and 22 inside areas 48 and 50 is followed by an LPCVD deposition of a layer 54 of undoped polycrystalline or amorphous silicon. Layer 54 has a thickness in the range of 500 to 2000 Angstroms. Because of the excellent step coverage of polysilicon, layer 54 will fill gap 52.

Figure 1E:
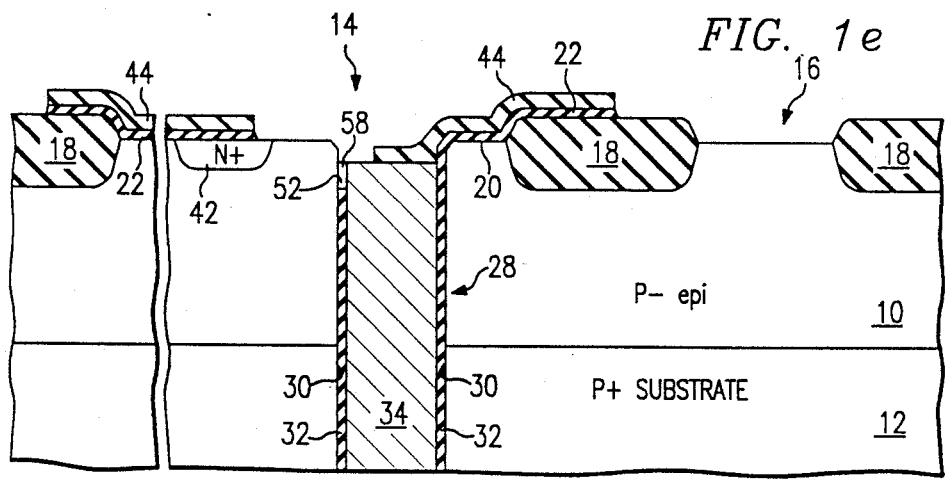

Turning now to FIG. 1e, poly layer 54 is etched isotropically, leaving only a polysilicon filament 58 within gap 52. An anisotropic etch may be used instead.

Figure 1F:
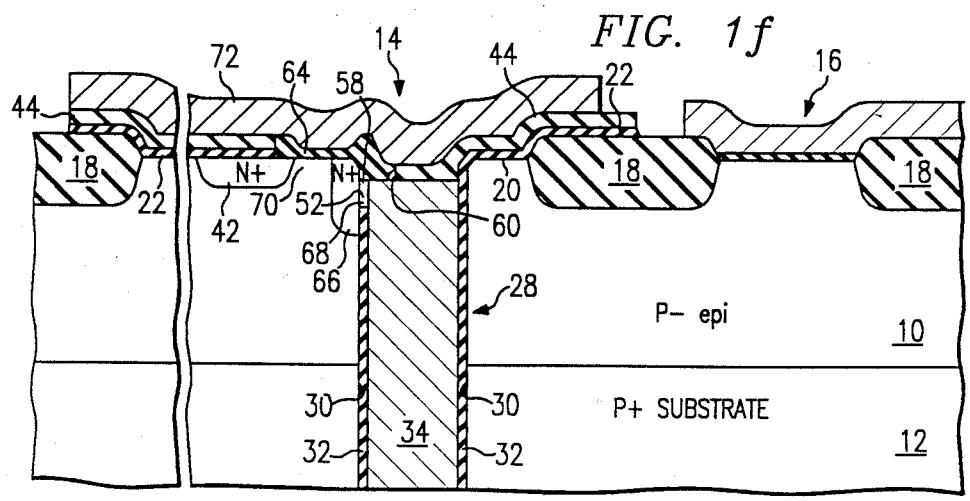

The final process steps are illustrated in FIG. 1f. The removal of polysilicon layer 54 (FIG. 1d) exposed several areas of epitaxial surface 20, particularly in peripheral circuit area 16 and between trench 28 and diffused bit line 42. The wafer is next subjected to a thermal cycle under an oxygen atmosphere to grow a thin (200 to 300 Angstroms) gate oxide layer 64. As this happens, dopant is diffused from heavily doped capacitor electrode 34, through the polysilicon material filling gap 52 and into epitaxial layer 10 to form an (n+) diffused region 66. Polysilicon filament 58 will be doped through the diffusion of dopant from dopant source 34. Filament 58 will be oxidized at a rate of about four times that of the gate oxide 64.

The oxidation of poly filament 58 defines a conductive polysilicon plug 68 that fills gap 52. As previously described, the undoped poly constituting plug 68 will be doped to be (n+) by diffusion of dopant from heavily doped capacitor electrode 34, and dopant will continue to diffuse through plug 68 to create an (n+) diffused region 66 that will act as the source of the pass gate transistor. A region 70 of (p) epitaxial layer 10 in between diffused regions 42 and 66 will act as a transistor channel. As can be seen, the degree of undercutting performed by the intentional overetch of layer 44 in FIG. 1d will determine the depth of diffused region 66.

After the poly oxidation and dopant diffusion step, a doped layer of polysilicon is deposited by LPCVD, patterned and etched to define a plurality of word line conductors 72 (one shown) and other poly conductors 74 (one shown). Succeeding metal interconnect and passivation steps (not shown) complete the DRAM array and peripheral circuitry.

Since capacitor electrode 34 is electrically coupled through plug 68 to source region 66, no surface conductor strap is required. The use of a diffused bit line 42 instead of a bit line conductor, together with the just-mentioned method of connecting the capacitor electrode 34 to the source region 66, eliminates the requirement for an entire conductor level, thus simplifying the fabrication of the device.

Figure 2:
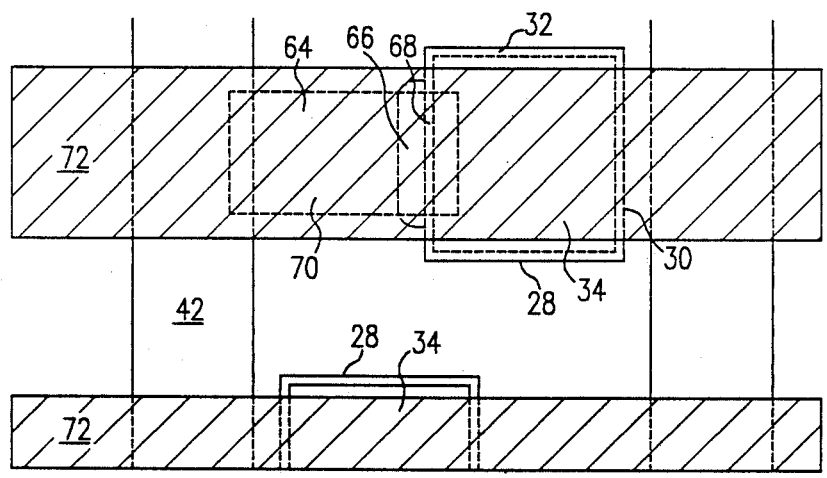
FIG. 2 is a schematic plan view showing one layout of an array of DRAM cells according to the invention.

A plan view of the layout of the cell fabricated as illustrated in FIGS. 1a–1f is shown in FIG. 2, with like numbers identifying like structure as appropriate. As shown, the trench 28 for any particular cell can be placed to be extremely close to the next bit line 42. Using one micron design rules, only 0.2 micron need separate trench sidewall 30 from bit line 42 as a misalignment tolerance. Where 0.6 micron design rules are used, as for the fabrication of a 16 megabit DRAM, the separation between trench 28 and bit line 42 can be even less. The resultant savings in cell area allows a reduction in array size.

Figure 3A:
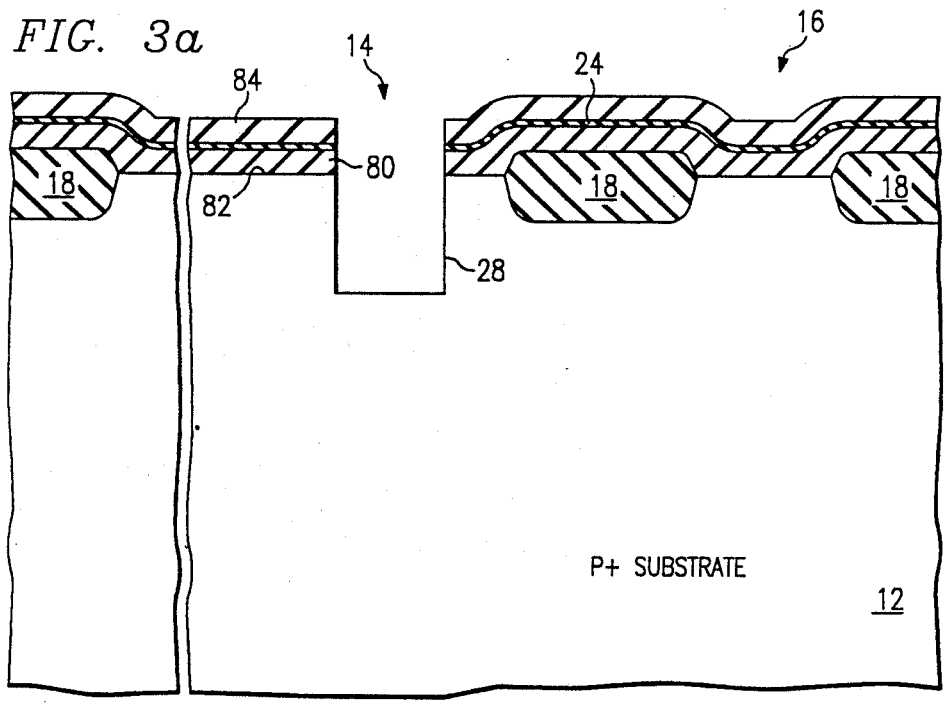
FIGS. 3a-3c are greatly enlarged schematic sectional views of a semiconductor substrate showing successive stages in the fabrication of an alternative DRAM cell according to the invention.
Figure 3B:
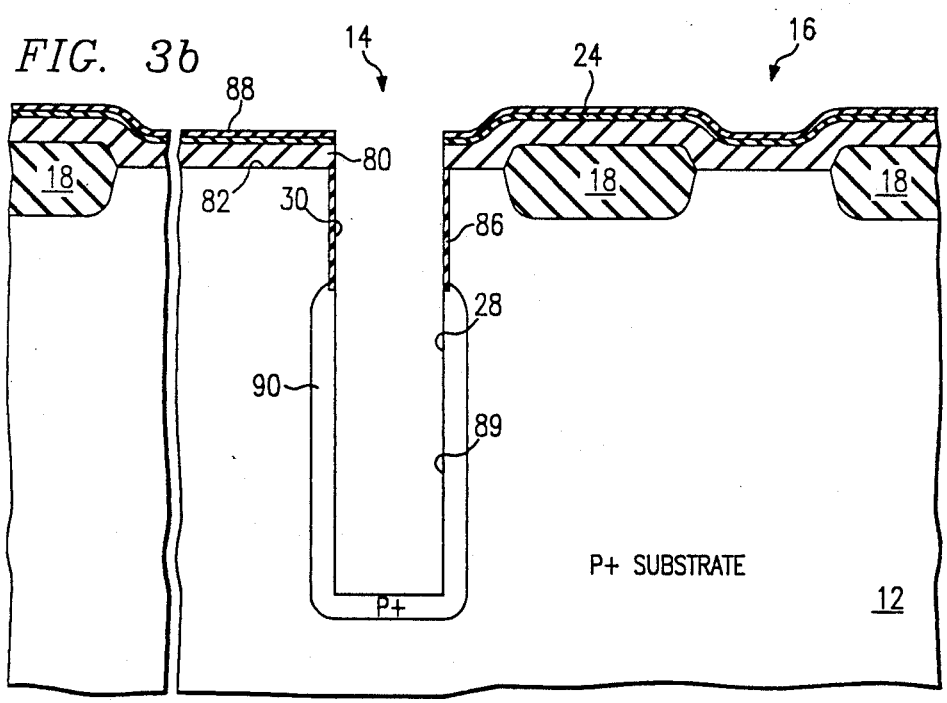
Figure 3C:
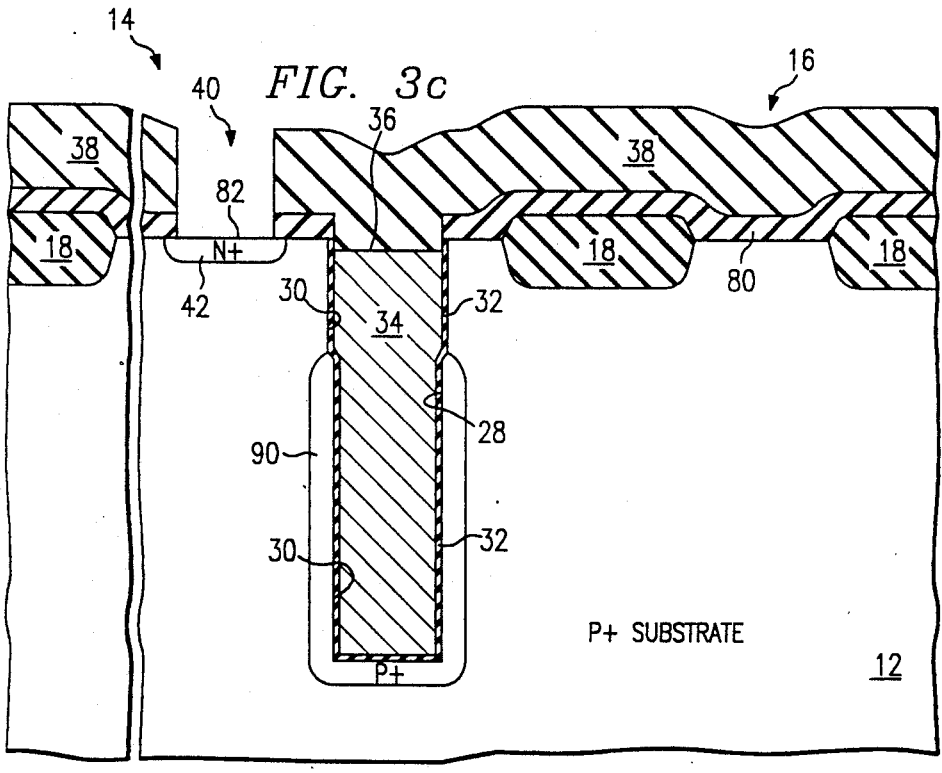

An alternative embodiment is illustrated in FIGS. 3a–3c, where numbers used in FIGS. 1a–1f identify like parts as appropriate. In this embodiment, a relatively thick layer 80 of oxide is deposited on an upper surface 82 of a semiconductor substrate 12. An epitaxial layer is not required in this embodiment, and is advantageously omitted due to its relative expense. Oxide layer 80 is on the order of 2000 to 4000 Angstroms thick. After the forming of oxide layer 80, a nitride layer 24 and a second mask oxide layer 84 are deposited as before to form an oxide/nitride/oxide hard mask.

The trilayer hard mask is patterned and etch to define a trench area 26 as before. A trench 28 is then anisotropically etched, but only to an initial depth of about one to two microns.

Referring next to FIG. 3b, an oxide layer 86 is formed either through a thermal cycle or by chemical vapor deposition (CVD). This oxide layer is then anisotropically etched back to form sidewall oxide layer 86 as shown. Top oxide layer 84 disappears in this etch step if the etch were anisotropic; otherwise, a thinner top oxide layer 88 remains.

Next, trench 28 is extended by an anisotropic etch until its total depth is in the range of six to ten microns. The sidewalls 30 of trench 28 are then doped along their exposed lower portions 89 with boron, either by oblique implantation or in a furnace with an appropriate boron source to produce a (p+) region 90 surrounding the lower portion of trench 28. Region 90 is formed in order to enhance the depletion capacitance of the storage capacitor, thereby increasing the resultant capacitance of the cell. The dopant concentration inside (p+) region 90 should preferably be on the order of $10^{19}$ to $10^{20}$ ions/cm$^3$.

Turning now to FIG. 3c, sidewall oxide 86 is removed along with other trench sidewall residues through the use of a wet etch. A storage oxide layer 32 is then grown in its place along the entire length of sidewalls 30. A doped polysilicon material is then deposited through LPCVD as before and etched back to form capacitor electrode 34, and nitride layer 24 (FIG. 3b) is stripped. A layer 38 of photoresist is then deposited and patterned to define a bit line implantation area 40. Arsenic and phosphorus is implanted as before to create a diffused bit line 42. Subsequent fabrication steps are the same as those described in FIGS. 1b–1f. This alternative embodiment will yield a DRAM cell capacitor having enhanced capacitance without requiring an expensive epitaxial layer.

In summary, a DRAM cell structure using a diffused bit line and a storage oxide gap plug to connect the capacitor electrode to a source region of the pass gate transistor has been described. Since a first level of metal interconnect is avoided, and since the capacitor electrode is used to store charge, the trench capacitor may be positioned very close to the next bit line, thereby saving space.

While preferred embodiments of the invention and their advantages have been illustrated by the above detailed description, the invention is not limited thereto but only by the scope and spirit of the appended claims.

WHAT IS CLAIMED IS:

1. A memory cell formed in a semiconductor layer of a first conductivity type, comprising:
   a trench formed into a face of said semiconductor layer, said face substantially planar about said trench;
   sidewalls of said trench having a storage insulator formed thereon to define a trench hole;
   a conductive capacitor electrode formed in said trench hole and having an upper surface;
   a portion of said storage insulator removed from a selected side of said sidewalls to create a gap extending downwardly from said upper surface by a predetermined depth;
   a conductive plug formed in said gap to electrically couple said electrode to said semiconductor layer; and
   a pass gate transistor, a diffused region of said transistor formed to be of a second conductivity type and formed in said semiconductor layer adjacent said plug.

2. The memory cell of claim 1, wherein the conductivity type of said semiconductor layer is (p) type.

3. The memory cell of claim 1, wherein said electrode comprises a highly doped polycrystalline or amorphous material comprising silicon.

4. The memory cell of claim 3, wherein said electrode is doped to be (n) type.

5. The memory cell of claim 1, wherein said predetermined depth of said gap is in the range of 3,000 to 5,000 Angstroms.

6. The memory cell of claim 1, wherein said storage insulator comprises oxide.

7. The memory cell of claim 1, wherein said plug comprises highly doped polycrystalline or amorphous silicon.

8. The memory cell of claim 1, wherein said diffused region is formed adjoining said trench and said face.

9. The memory cell of claim 1, wherein said semiconductor layer comprises a silicon substrate, said trench having an outer portion adjacent said face and an inner portion remote therefrom, a (p) type doped region formed in said semiconductor substrate adjacent said storage insulator along said inner portion to enhance capacitance.

10. An array of trench-capacitor memory cells formed in a semiconductor layer of a first conductivity type, comprising:
 a plurality of spaced-apart elongate parallel conductive bit lines of a second conductivity type formed in said semiconductor layer;
 a plurality of spaced-apart elongate parallel conductive word lines insulatively disposed over a face of said semiconductor layer and formed at an angle to said bit lines;
 a plurality of memory cells formed in said semiconductor layer between said bit lines and each having a trench capacitor and a pass gate transistor, a diffused region of said transistor formed in said layer to be of said second conductivity type;
 an electrode of said trench capacitor electrically coupled to said diffused region; and
 a transistor channel region of said first conductivity type disposed on said face of said semiconductor layer between said diffused region and one of said bit lines, a pass gate insulator formed on said face over said channel region, one of said word lines formed on said pass gate insulator for actuation of said transistor.

11. The array of claim 10, wherein said capacitor is formed in a trench having sidewalls including major and minor portions thereof, a storage insulator layer formed on said major portion of said sidewalls, said capacitor electrode formed interiorly of said storage insulator; and
 said minor portion of said sidewalls disposed adjacent said diffused region, a conductive plug disposed between said diffused region and said capacitor electrode along said minor portion of said sidewalls for electrically coupling said gap electrode to said diffused region.

12. The array of claim 11, wherein said plug and said capacitor electrode comprise polycrystalline or amorphous silicon doped to be of said second conductivity type.

13. The array of claim 10, wherein said capacitor is laterally disposed between said one of said bit lines and a second of said bit lines, said capacitor separated from said second of said bit lines by no more than about 0.2 microns.

14. A dynamic random access memory cell formed at a face of a (p) type semiconductor layer, comprising:
 a trench formed into a face of said semiconductor layer, said face substantially planar about said trench;
 sidewalls of said trench having a storage oxide layer formed thereon to define a trench hole;
 a highly doped polycrystalline silicon capacitor electrode formed in said trench hole and having an upper surface near said face;
 a portion of said storage oxide near said face removed from a selected side of said sidewalls to create a gap extending downwardly from said upper surface by a predetermined depth;
 a conductive polycrystalline plug formed in said gap to connect said electrode to said semiconductor layer, said gap conductor doped to be of said second conductivity type; and
 a pass gate transistor, a first diffused region of said transistor formed to be of said second conductivity type and formed in said semiconductor layer adjacent said plug.

15. The memory cell of claim 14, and further comprising a second diffused region of said pass gate transistor formed to be of said second conductivity type and formed at said face of said semiconductor layer, a pass gate channel region of said first conductivity type spacing said first diffused region from said second diffused region; and
 a pass gate conductive electrode insulatively disposed over said pass gate region to actuate said pass gate transistor.

* * * * *